(12) United States Patent
Hsieh et al.

(10) Patent No.: US 6,767,679 B2
(45) Date of Patent: Jul. 27, 2004

(54) CORRECTING THE POLYGON FEATURE PATTERN WITH AN OPTICAL PROXIMITY CORRECTION METHOD

(75) Inventors: Chang-Jyh Hsieh, Hsin-Chu (TW); Jiunn-Ren Hwang, Hsin-Chu (TW); Jui-Tsen Huang, Taipei (TW)

(73) Assignee: United Microelectronics Corp., Hisn-Chu (TW)

( * ) Notice: Subject to any disclaimer, the term of this patent is extended or adjusted under 35 U.S.C. 154(b) by 81 days.

(21) Appl. No.: 10/037,132

(22) Filed: Jan. 2, 2002

(65) Prior Publication Data

US 2003/0124441 A1 Jul. 3, 2003

(51) Int. Cl.$^7$ .............................. G03F 9/00; G03C 5/00
(52) U.S. Cl. ........................ 430/30; 430/296; 430/942
(58) Field of Search ........................... 430/30, 296, 942

(56) References Cited

U.S. PATENT DOCUMENTS 6,080,527 A * 6/2000 Huang et al. ............... 430/296

* cited by examiner

Primary Examiner—Christopher G. Young
(74) Attorney, Agent, or Firm—Merchant & Gould P.C.

(57) ABSTRACT

The present invention is provided a method to use a pattern section without extra serif to correct the polygon feature pattern with at least one inner corner. Such that the polygon feature pattern with at least one inner corner can achieve effectively OPC (optical proximity correction) without adding any extra data point. Therefore, the present invention can instead of the conventional serif and achieves the effective OPC. In addition, the mask writing time is also improved since the original feature pattern is divided into a few rectangular-shaped mask writing units or trapeze-shaped mask writing units for regular mask writing, and the inner corner is/are not in the middle of each divided mask writing units. The mask inspection is also simplified and easier to calibration since a simple geometry other than complex serif is used.

5 Claims, 17 Drawing Sheets

CORRECTING THE POLYGON FEATURE PATTERN WITH AN OPTICAL PROXIMITY CORRECTION METHOD

BACKGROUND OF THE INVENTION

1. Field of the Invention

The present invention generally relates to an optical proximity correction, and more particularly to an optical proximity correction method for modifying the polygon feature pattern with inner corner.

2. Description of the Prior Art

The minimum feature sizes of integrated circuits (ICs) have been shrunk for years. This feature size reduction, various process limitations have made IC fabrication more difficult. One area of fabrication technology in which such limitations have appeared is photolithography.

An important component of photolithographic apparatus is a "reticle" which includes a pattern corresponding to features at one layer in an IC design. Such reticle typically includes a transparent glass plate covered with a patterned light blocking material such as chromium.

For advance SOC (system on chip), the complexity of design and the file size of mask tooling both dramatically increased. For example, a 50 GB (giga bytes) file size, it may take two days for mask writing. Therefore, how to reduce the file size is an important issue. The traditional OPC (optical proximity correction) methodology corrects the inner corner pattern by adding extra serifs. For a single inner corner, the number of data points can be expanded from one to five. Overall, this approach would increase the output file size and dramatically increase the mask writing time since the serif require adding extra data points. Thus, the data points of the file are increased and the writing speed is slow down.

FIGS. 1A to 3C show the conventional OPC (optical proximity correction) using inner serif for L-, T-, and cross-shaped feature patterns. Extra data points and mask writing units are required to define these OPC patterns. Small mask writing units causes a large file size, a complex and slower mask writing procedure.

FIG. 1A to FIG. 1C shown a reticle corresponding to an integrated circuit (IC) pattern. FIG. 1A shows an un-corrected L-shaped feature pattern 10. To avoid the L-shaped feature pattern with a corner, there is a method to modify the un-corrected L-shaped pattern 10 with an OPC method such as serif method to form a corrected L-shaped feature pattern 10a which has an inner corner 14 as shown in FIG. 1B. Therefore, the extra data points and the file size are also increased after correction steps. The un-corrected L-shaped feature pattern 10 has only one data point 12A, however, the corrected L-shaped feature pattern 10a has four extra data points, 12B, 12C, 12D, and 12E. Therefore, the computer data-processing capacity and file size are increased that according to increase of data points. Referring to FIG. 1C, the corrected feature pattern 10a is divided into five rectangular feature patterns 16a through 16e, such that increase two extra mask units after the mask dividing step.

Then, referring to FIG. 2A shown the uncorrected T-shaped feature pattern 20 with two data points 22A and 22B. The correcting steps as the FIG. 1A to FIG. 1C, a corrected T-shaped feature pattern 20a with two inner corners 24A and 24B are formed after serif correction method as shown in FIG. 2B and has eight extra data points 22C through 22J. In the FIG. 2C, there are seven extra mask units 26a through 26h after a mask-dividing step. Next, referring to FIG. 3A that shown the un-corrected crossed-shaped feature pattern 30 with four data points 32A through 32D. As the above-mentioned, after serif correction method, the corrected crossed-shaped feature pattern 30a with four inner corners 34a through 34d and has sixteen extra data points 32E through 32T, which are increased after OPC method. Therefore, the output file size is increased and the mask writing time is dramatically increased since the serif requires adding extra data points.

Next, the FIG. 4 is schematic vertical views showing a contour image of the un-corrected crossed-shaped feature pattern 30. The scope of the solid line is an original un-corrected crossed-shaped feature pattern 30, after exposure steps, the scope of dotted line is a simulation area image 40 is smaller than the original un-corrected crossed-shaped feature pattern 30. But the simulation area images have four corners 42a, 42b, 42c, and 42d, and further the corner still causes the pattern inspection issue. Furthermore, in order to solve the corner issue, the conventional technique is utilized a serif method to modify the conventional crossed-shape feature pattern 30. According to FIG. 3B, after exposure step, the simulation area image 40a is approach to the original feature pattern 30a with using serif method as shown in FIG. 5. In the FIG. 5, even though the simulation area image 40a is approach to the original feature pattern 30a, but the simulation area image 40a has corners and still causes the file size increased, loading mask time, and mask writing time are increased.

SUMMARY OF THE INVENTION

In accordance with the present invention, a method is provided to correct the feature pattern with inner corner fidelity by an optical proximity correction (OPC) method, the improved method substantially reduces the OPC output file size, improves the mask writing with a few rectangular-shaped writing units or trapeze-shaped writing units for regular mask writing, and save the mask inspection time.

It is an object of this present invention to provide an improved OPC (optical proximity correction) method without adding extra serifs to obtain a high-resolution pattern mask.

It is another object of this present invention to provide an effectively OPC to reduce the OPC output file size.

It is still another object of this present invention to provide an OPC method to correct the polygon feature pattern and perform the plurality of the mask writing with a few rectangular-shaped writing units or trapeze-shaped writing units for regular mask writing to improve the mask writing time.

It is a further object of this present invention to provide a method to improve the mask uniformity and feature pattern inspection.

In one embodiment, the approach of the present invention uses a pattern section without adding extra serif to correct the polygon feature pattern. Correcting the polygon feature pattern with at least one inner corner that can achieve effectively OPC (optical proximity correction) without adding extra data points and mask writing units. Therefore, the present invention can instead of four as the conventional serif and achieve the effectively OPC. In addition, the mask writing time is also improved since the original feature pattern is divided into a few rectangular-shaped mask writing units or trapeze-shaped mask writing units for regular mask writing units, and the inner corner is/are not in the middle of each of the divided mask writing unit (rectangular mask writing units or trapeze mask writing units). The feature pattern inspection is also simplified and easier to calibration since a simple geometry other than complex serif is used.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

The approach of the present invention uses a pattern section without adding extra serif. Correcting the feature pattern with paired inner corners or a single inner corner can achieve the effectively OPC (optical proximity correction) without adding any extra data point, and the corner is/are not in the middle of each of the divided feature patterns, and further reduce the file size, herein the feature pattern can be a polygon feature pattern. Therefore, the pattern section method can be used instead of the conventional serif method to obtain the effectively OPC. In addition, the mask writing time is also improved since the original feature pattern is divided into a few rectangular-shaped (or trapeze-shaped) mask-writing units for regular mask writing. The pattern inspection is also simplified and easier to calibration since a simple geometry other than complex serif is used.

Figure 6A:
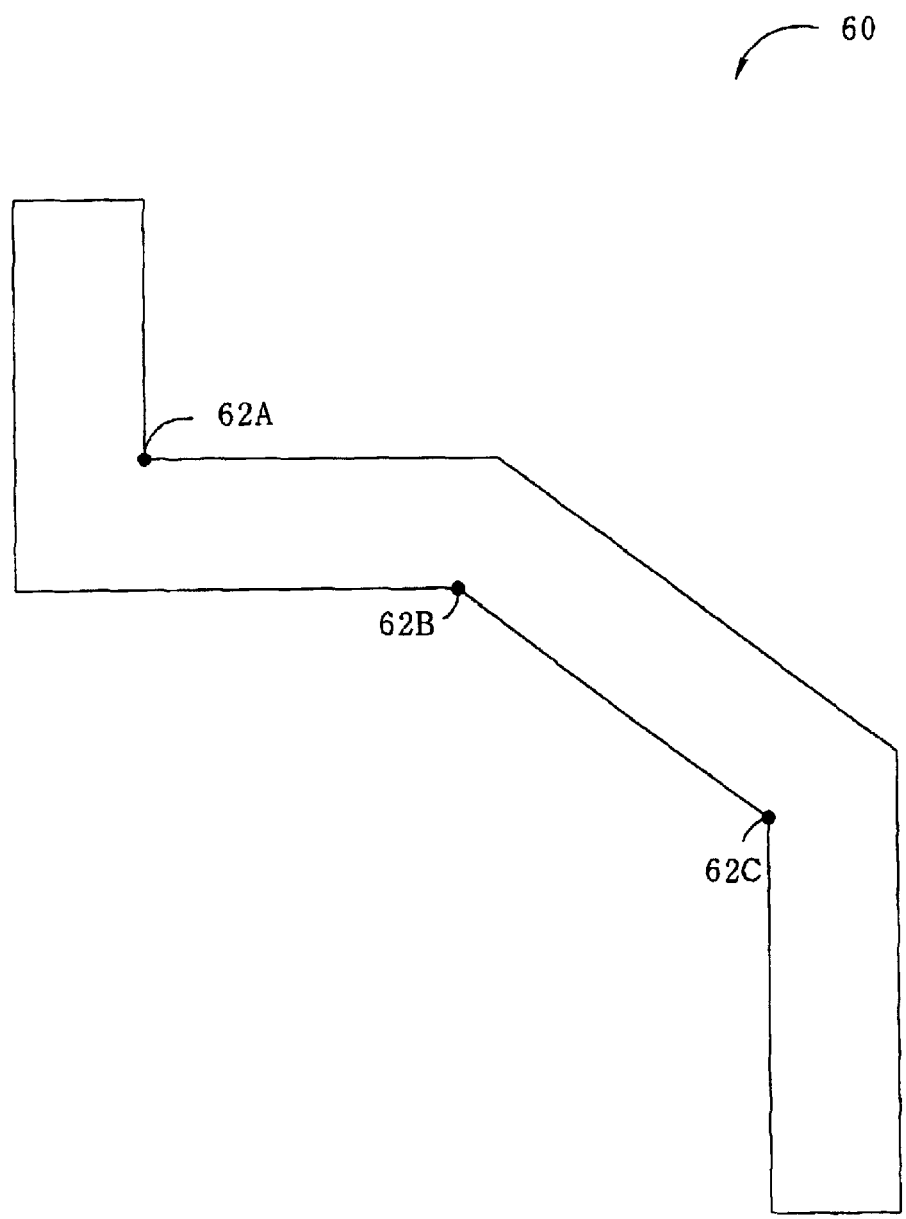
FIGS. 6A to 6D are schematic vertical views showing a method of dividing the polygon feature pattern into a plurality of divided feature pattern in accordance with a method disclosed herein.
Figure 6B:
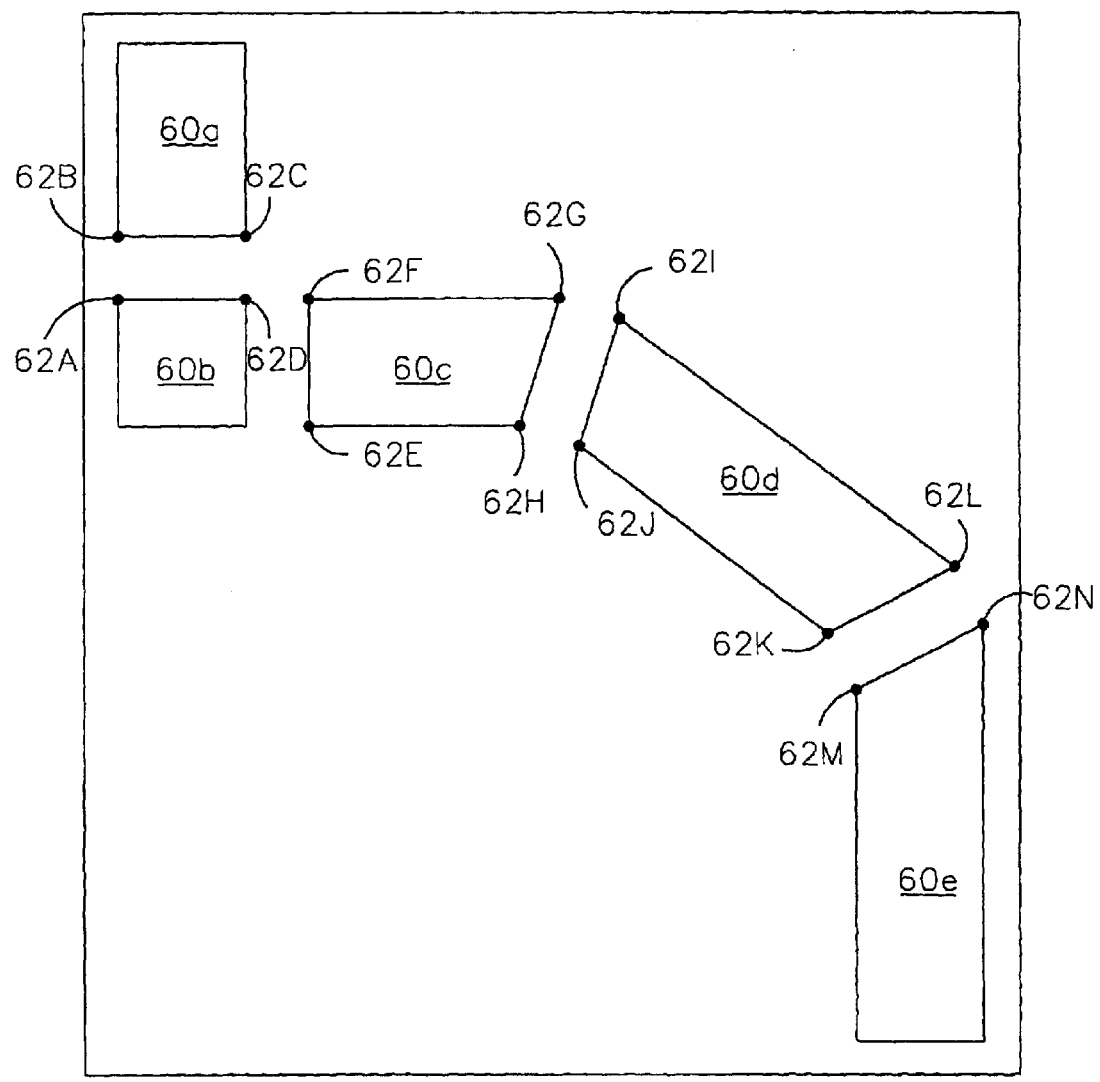
Figure 6C:
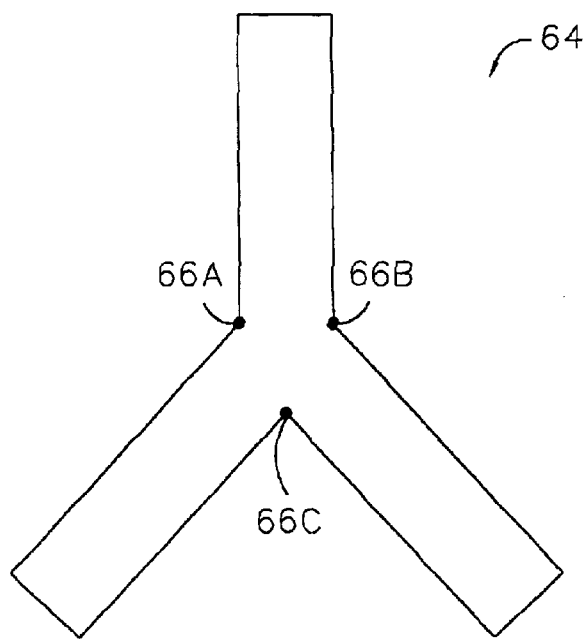
Figure 6D:
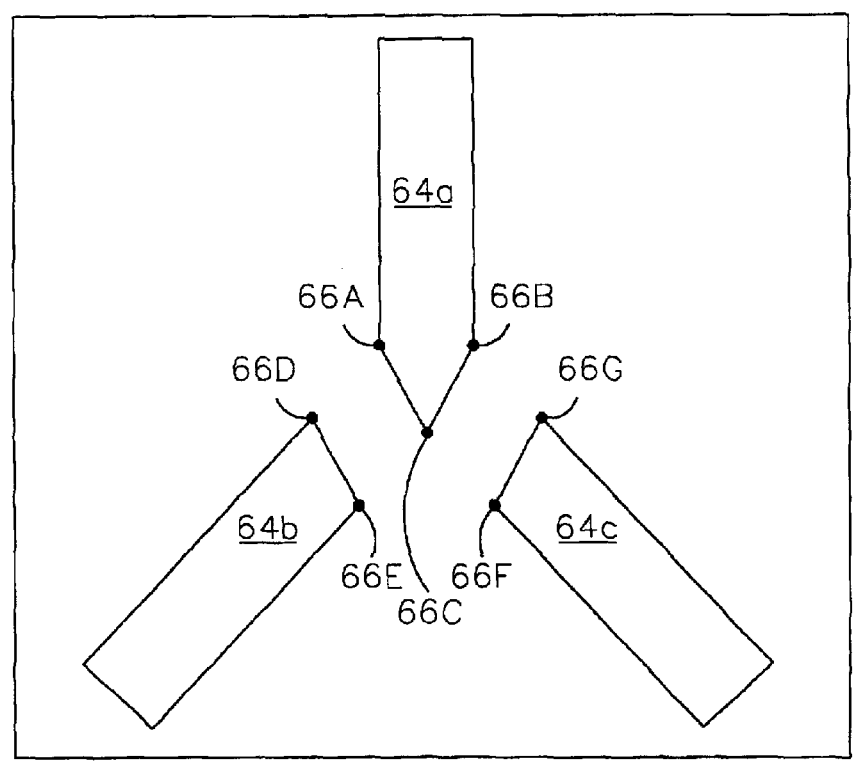

Referring to FIGS. 6A to 6B are schematic vertical views showing a polygon feature pattern 60 has three data points 62A, 62B, and 62C. The present invention is provided a method to divide the polygon feature pattern 60 into a plurality of trapeze-shaped feature pattern or rectangular-shaped feature pattern that without using serif to correct the feature pattern. As shown in FIG. 6B, the polygon feature pattern is divided into a plurality of trapeze-shaped or rectangular-shaped writing units 60a through 60e. Furthermore, the data point is increased eleven points 62D through 62N after dividing the polygon feature pattern. Even though the data point is increased, the pattern inspection time for trapeze-shaped or rectangular-shaped feature pattern is short than the original un-corrected polygon feature pattern 60, which is corrected by serif OPC method. Furthermore, in FIG. 6C is shown another polygon feature pattern 64 with at least three inner corners and three data points 66A, 66B, and 66C. According to above-mentioned the polygon feature pattern 64 is divided into three rectangular-shaped or trapeze-shaped feature pattern, 64a, 64b, and 64c. Moreover, the data point is increased four data points, 66D, 66E, 66F, and 66G. Similarly, the pattern inspection time can be reduced due to the original feature pattern 64 is simplified to simple feature patterns (64a, 64b, and 64c) (compare with the original feature pattern 64 is corrected by serif OPC method), and three inner corners are not in the middle of each three divided feature patterns 64a, 64b, and 64c (as shown in FIG. 6D) after the polygon feature pattern 64 is corrected. Herein, the angle of the polygon feature pattern is large than 0 degree and small than 180 degree.

Furthermore, the preferable embodiment of the present invention is provided a method to calculate the dividing distance between the divided feature patterns. In the present invention is used the L-shaped feature pattern as an illustration for calculating the gap width between the each of two divided feature patterns. For example, after OPC, the L-shaped feature pattern is divided into two or three pieces of divided feature pattern, the distance between the two adjacent divided feature patterns denote gap width D. The wavelength of the light denotes Latin word $\lambda$, the gap width D can be calculated by formula $D=\lambda/n$, wherein n is spacing, the values of n is between 1.2 to 8.0. According to the calculation method that can obtain the optimum distance between the divided feature pattern and the optimum OPC feature pattern.

The first preferable embodiment of the present invention provided a method to divide the polygon feature pattern into a plurality of rectangular-shaped or trapeze-shaped feature pattern such that the inner corner issue of the conventional serif correction method can be eliminated and the data point is reduced, and further the output file size can be reduced.

Figure 7A:
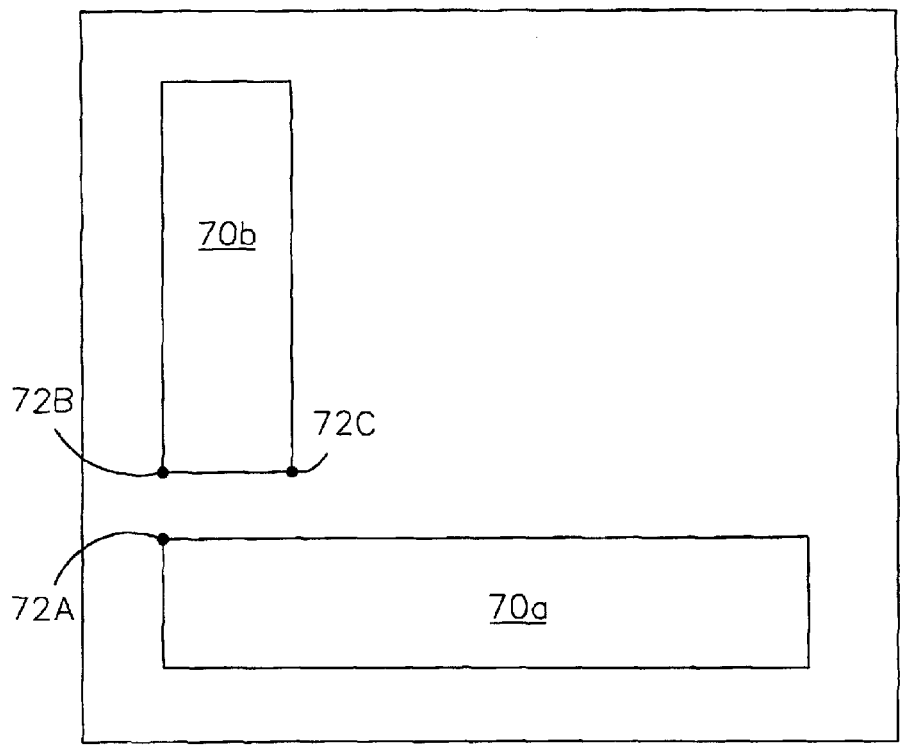
FIGS. 7A to 7D are schematic vertical views showing a method of dividing the L-shaped feature pattern into two divided feature pattern in accordance with a method disclosed herein.
Figure 7B:
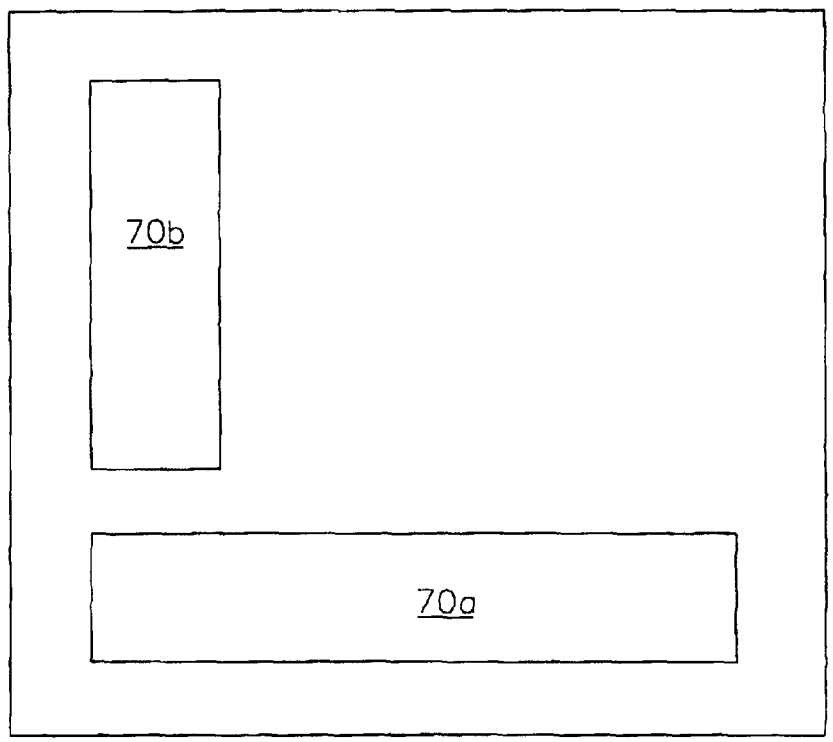
Figure 7C:
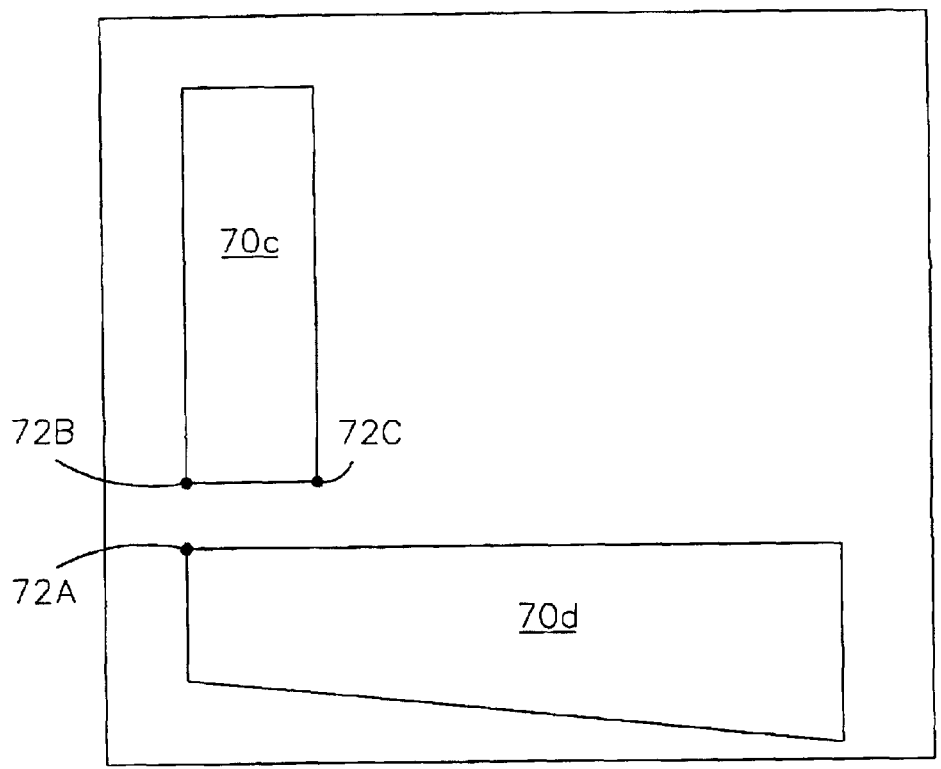
Figure 7D:
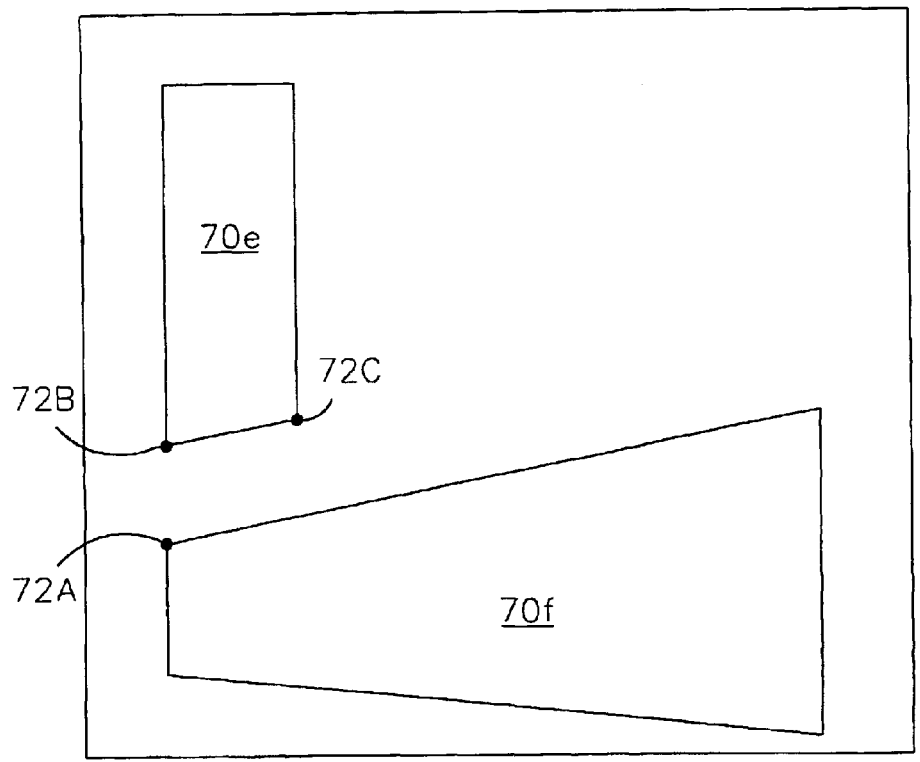
Figure 8A:
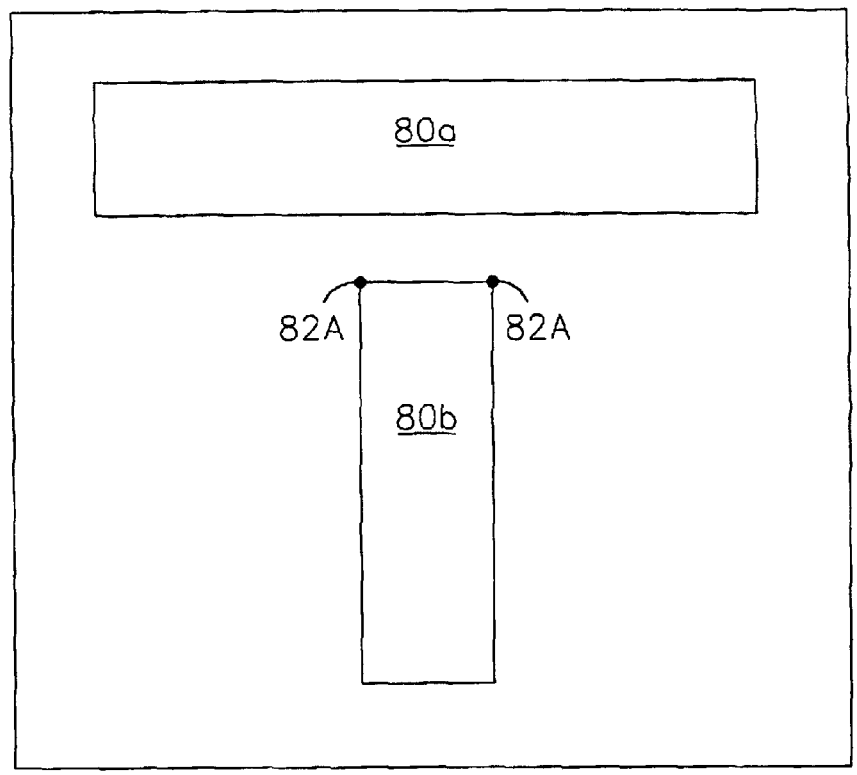
FIGS. 8A to 8B are schematic vertical views showing a method of dividing the T-shaped feature pattern into two divided feature pattern in accordance with a method disclosed herein.
Figure 8B:
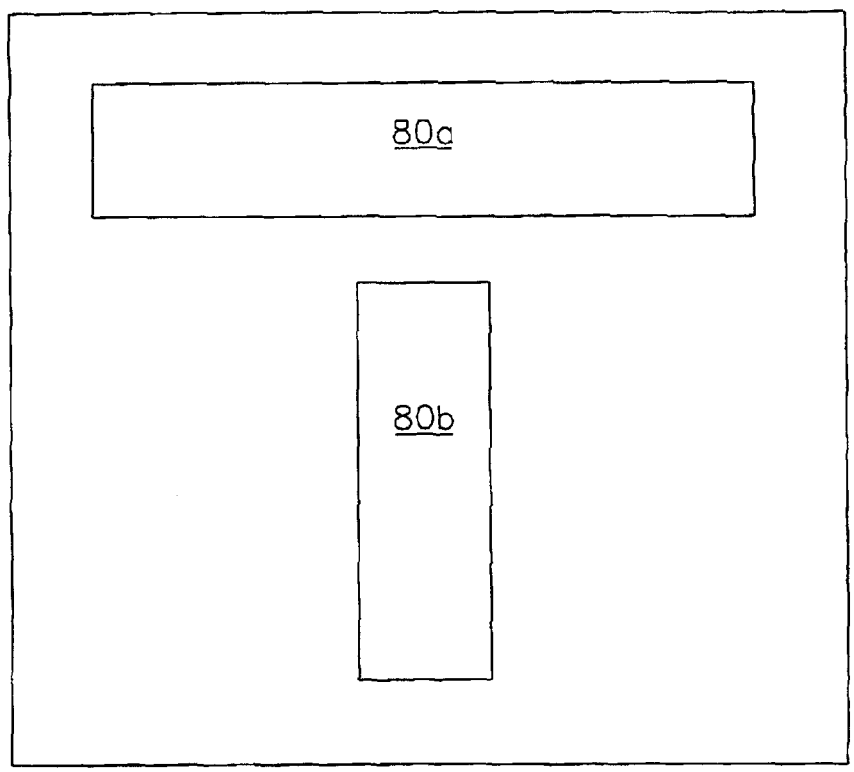
Figure 9A:
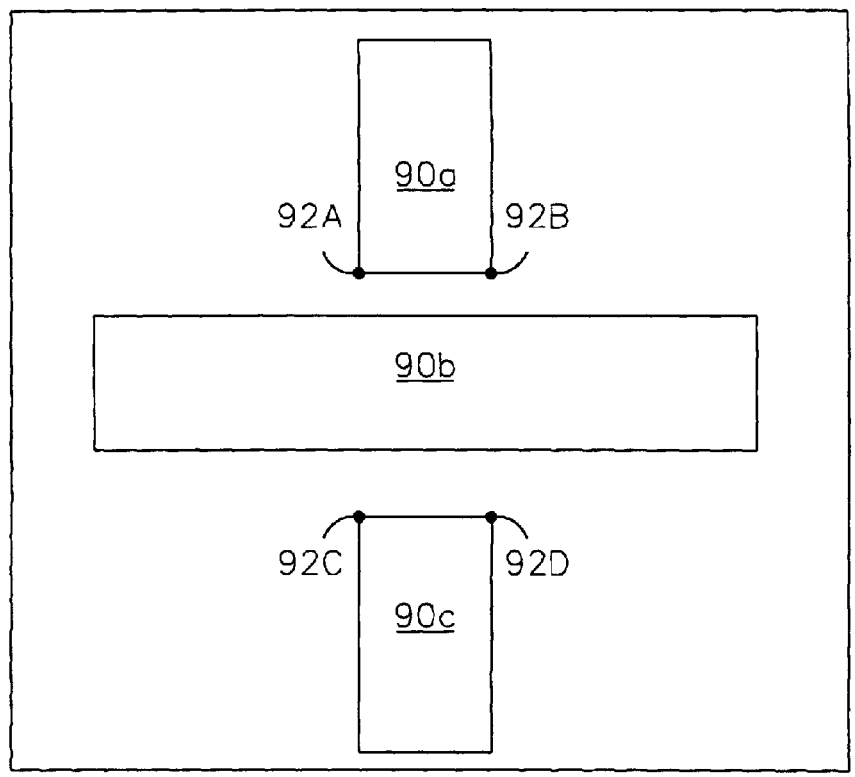
FIGS. 9A to 9B are schematic vertical views showing a method of dividing the crossed-shaped feature pattern into three divided feature pattern in accordance with a method disclosed herein.
Figure 9B:
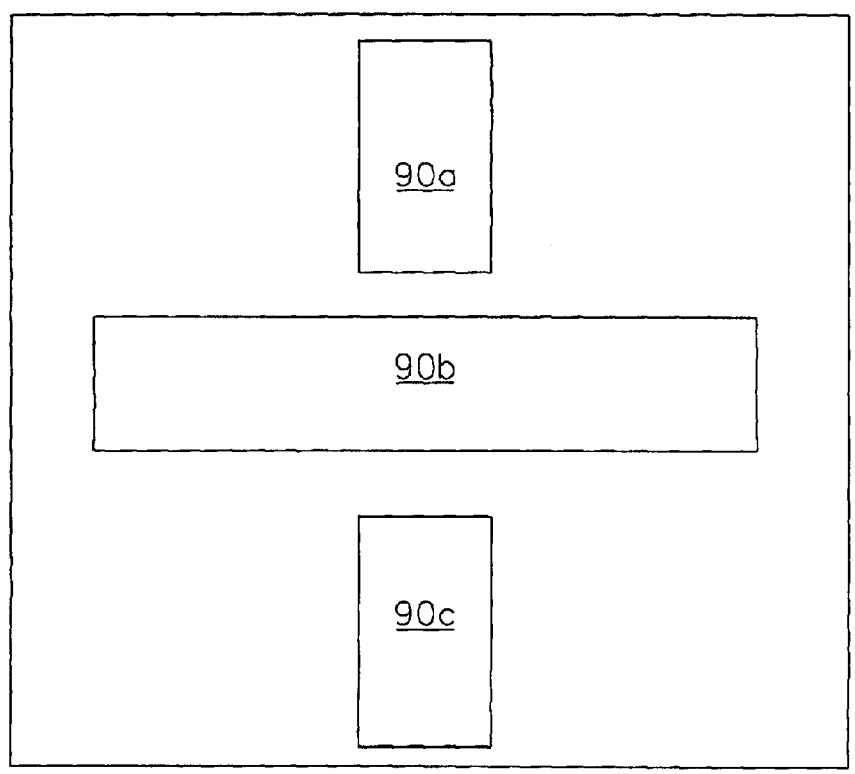

In FIG. 7A through FIG. 9B are schematic vertical views showing polygon feature patterns can be a L-shaped (shown in FIGS. 7A to 7D), a T-shaped (shown in FIGS. 8A to 8B), and a crossed-shaped (shown in FIGS. 9A to 9B). In the present invention is provided a transparent plate (not shown in FIG) as a mask, wherein the material of the transparent plate is quartz. Then, an opaque film coated on the transparent plate, wherein the opaque film can be chrome, PSM (phase shift mask), or half tone. The opaque film is imaged onto a photoresist layer coated on a wafer in photolithography. The embodiment of the present invention, the feature pattern shaped of the opaque film includes L-shaped, T-shaped, and crossed-shaped, and the angle is large than 0 degree and small than 180 degree.

Figure 1A:
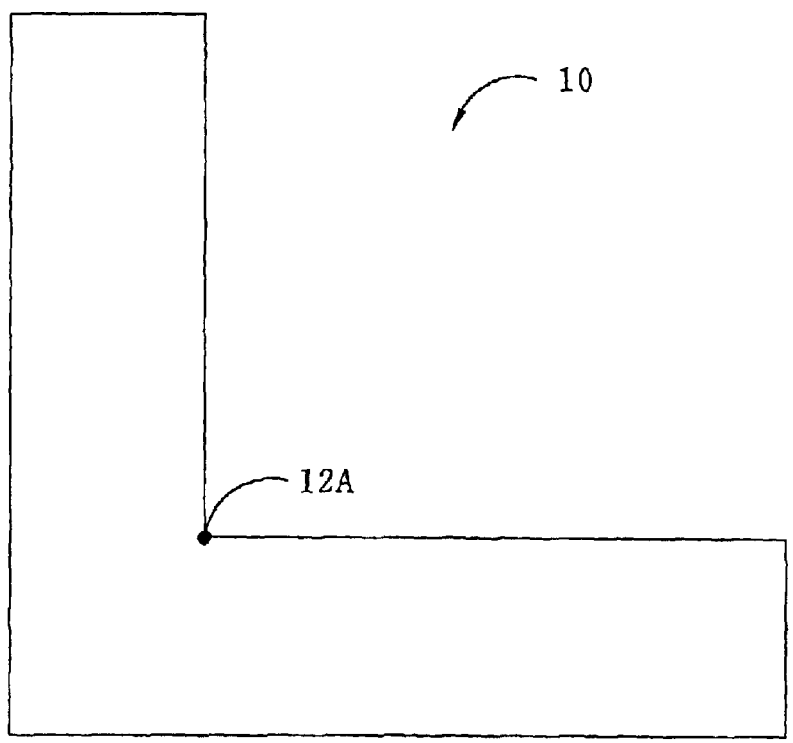
FIGS. 1A to 1C are schematic vertical views showing the steps for carrying out conventional optical proximity correction on a L-shaped feature pattern in accordance with the prior art.
Figure 1B:
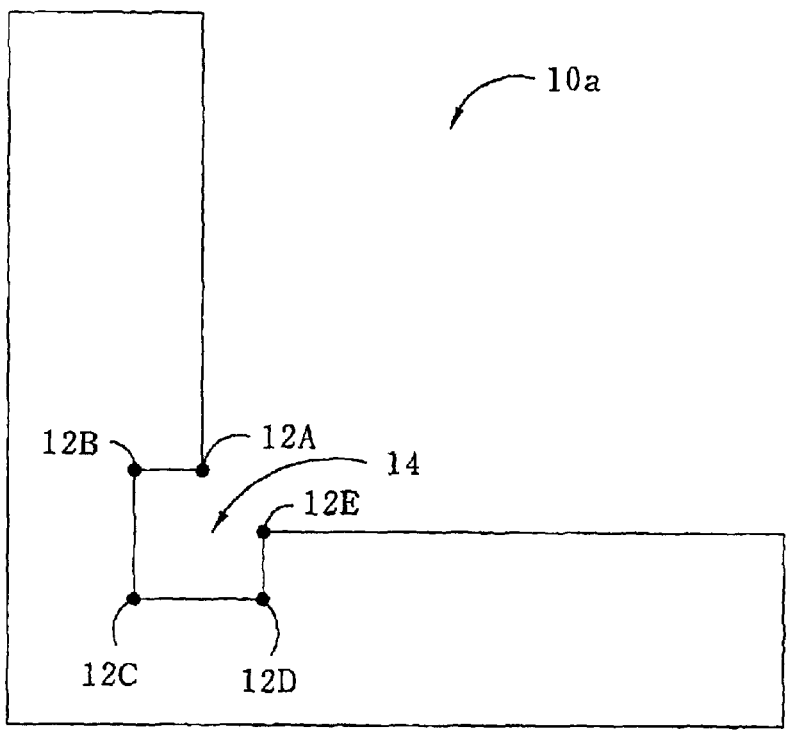
Figure 1C:
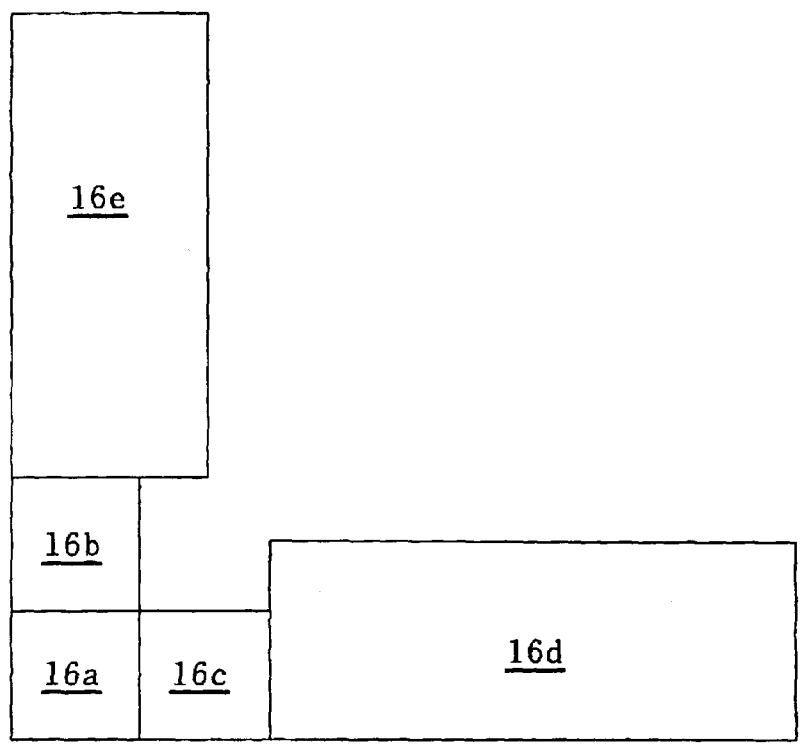

FIG. 1A is an uncorrected L-shaped feature pattern 10 with one data point 12A, in order to improve the mask loading time and pattern inspection time, the present invention is provided an OPC (optical proximity correction) method without using extra serif method to divide the un-corrected feature pattern 10 into two rectangular divided feature patterns 70a and 70b as shown in FIG. 7A. After dividing steps, two extra data points 72B and 72C are added and no extra mask unit increased as shown in FIG. 7B. Furthermore, the L-shaped feature pattern 70 can divide into two trapeze-shaped feature patterns such as shown FIGS. 7C and 7D. The advantage of the dividing method is that the less extra data points increased than the conventional serif correction method. Therefore, the file size can be reduced, no inner corner generated in the middle of each divided feature patterns, and the mask loading time, the mask writing time also can be improved.

Figure 2A:
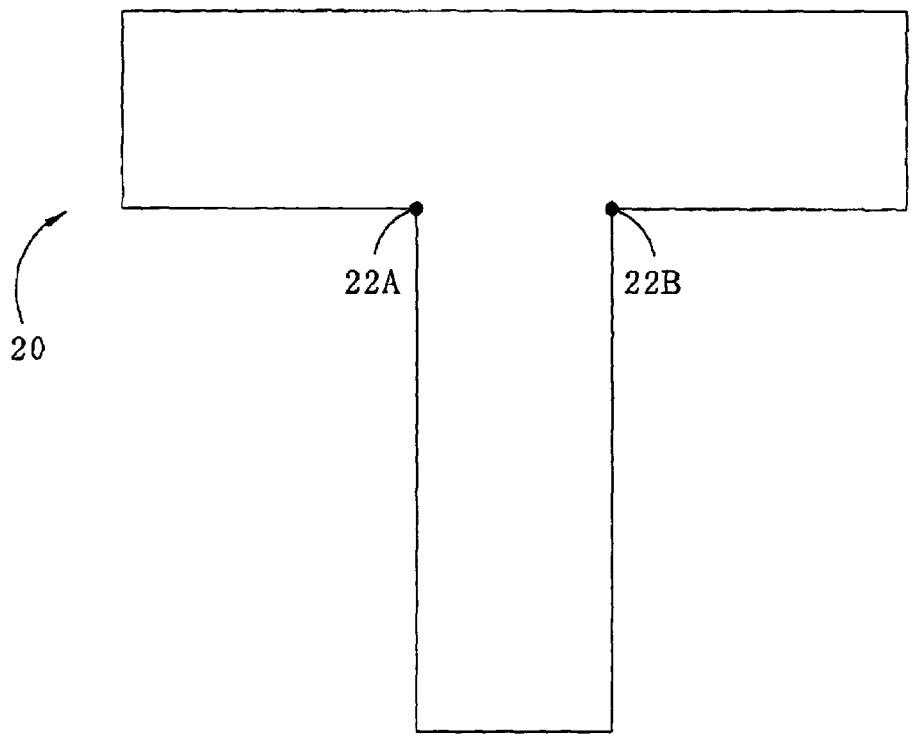
FIGS. 2A to 2C are schematic vertical views showing the steps for carrying out conventional optical proximity correction on a T-shaped feature pattern in accordance with the prior art.
Figure 2B:
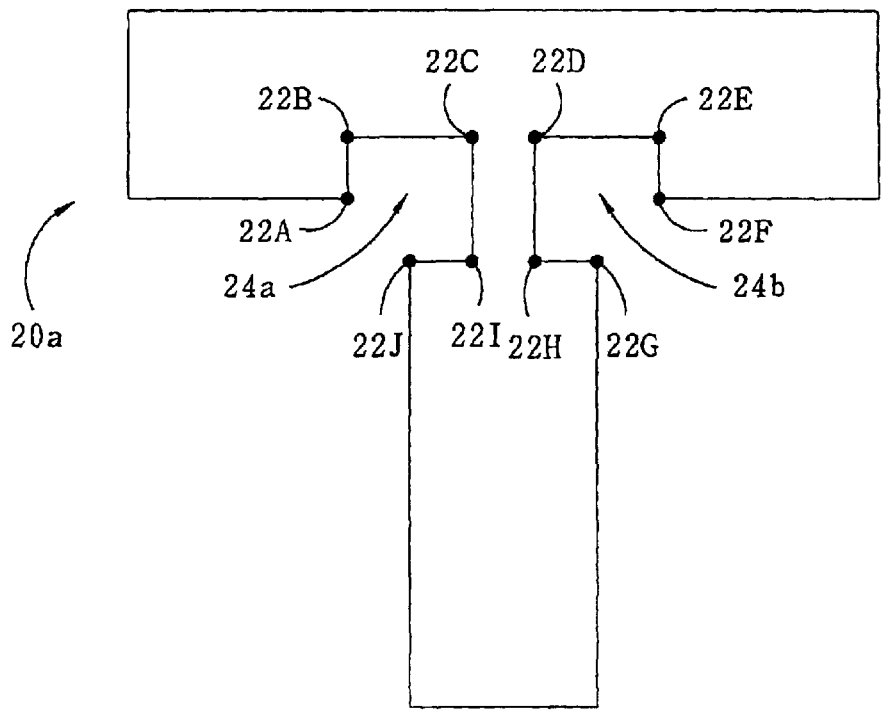
Figure 2C:
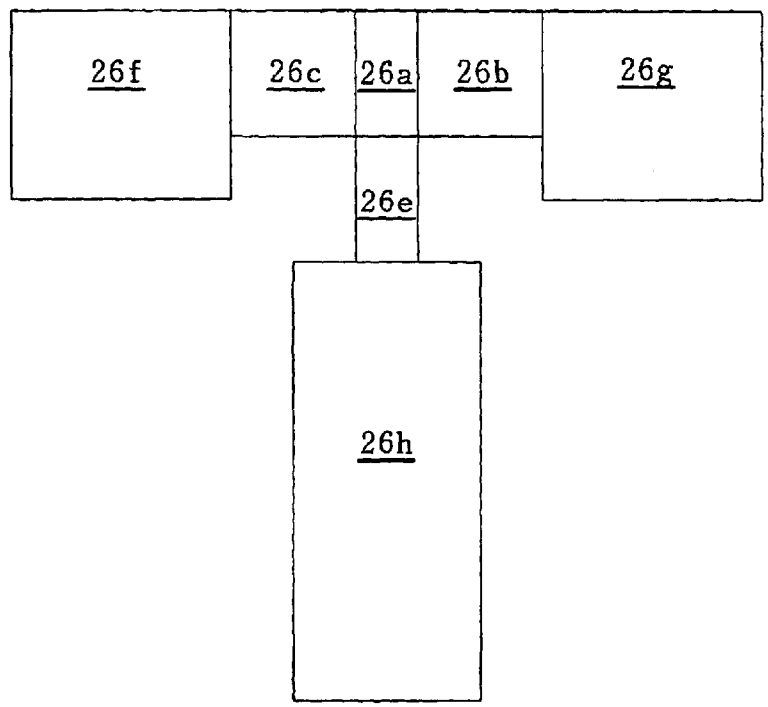

Next, referring to FIG. 8A, which is according to the FIG. 2A of the prior art that is an un-corrected T-shaped feature pattern 20 with two data points 82A and 82B. After dividing steps, the un-corrected T-shaped feature pattern 20 is divided into two pieces of divided feature patterns 80a and 80b as shown in FIG. 8A. Herein, the embodiment is merely provided the rectangular feature pattern to show, other feature pattern shaped as shown as FIG. 7C and FIG. 7D in thereinafter description. After dividing step, there is no extra data point in FIG. 8A (the un-corrected T-shaped feature pattern 20 of the FIG. 2A still has two data points 22A and 22B) and no extra mask unit (shown in FIG. 8B) increased after the un-corrected feature pattern 20 is divided.

Figure 3A:
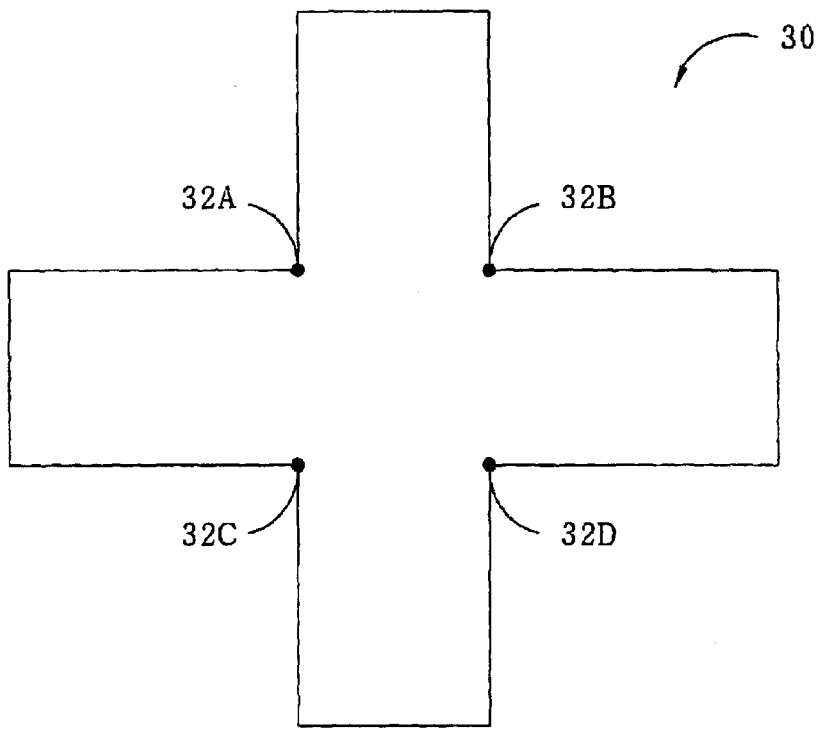
FIGS. 3A to 3C are schematic vertical views showing the steps for carrying out an optical proximity correction method on a crossed-shaped feature pattern in accordance with the prior art.
Figure 3B:
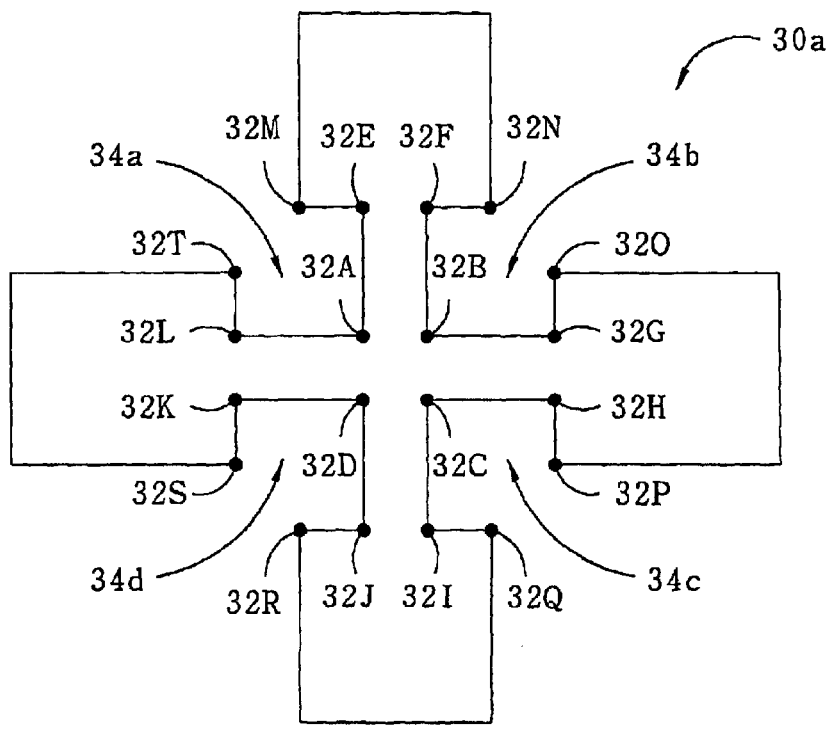
Figure 3C:
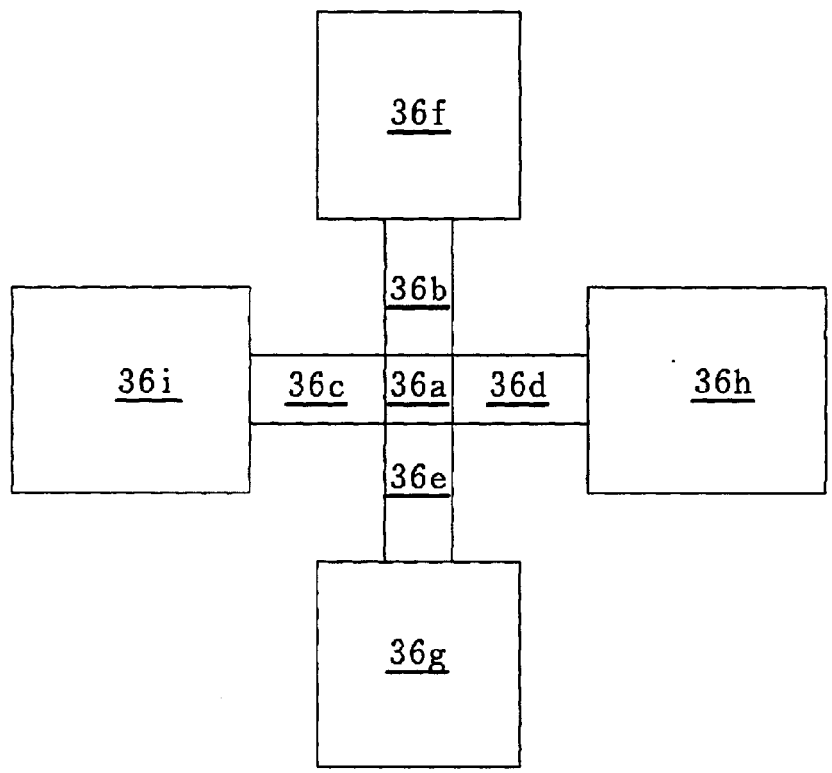
Figure 4:
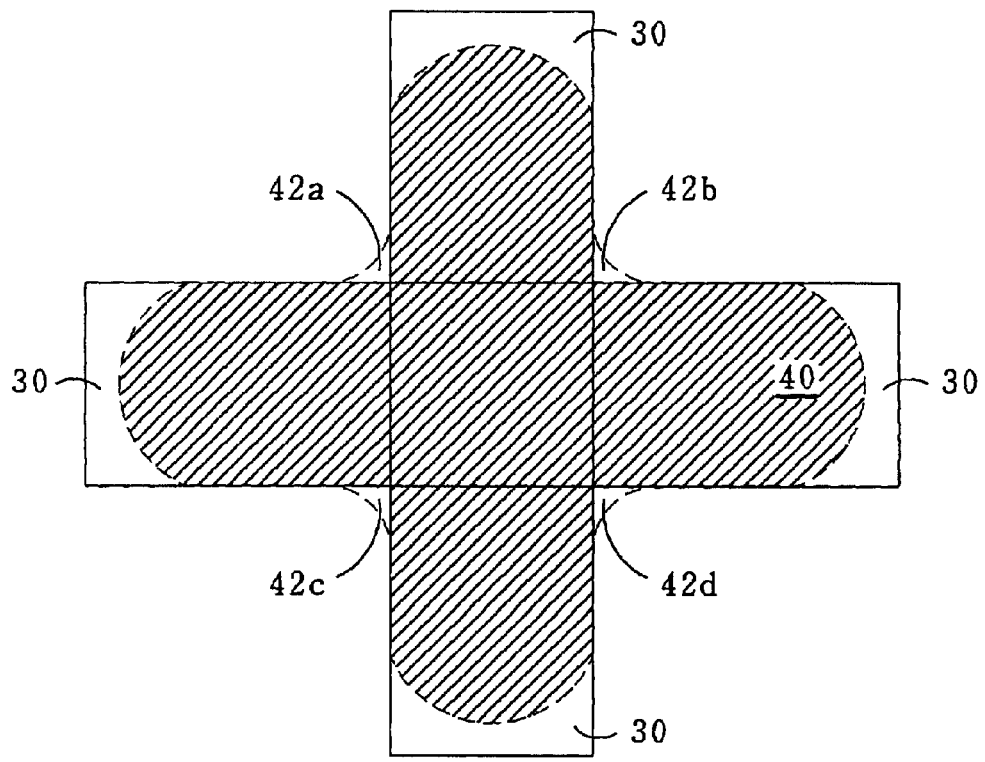
FIG. 4 is schematic vertical views showing the contour image of the crossed-shaped feature pattern in accordance with the prior art.
Figure 5:
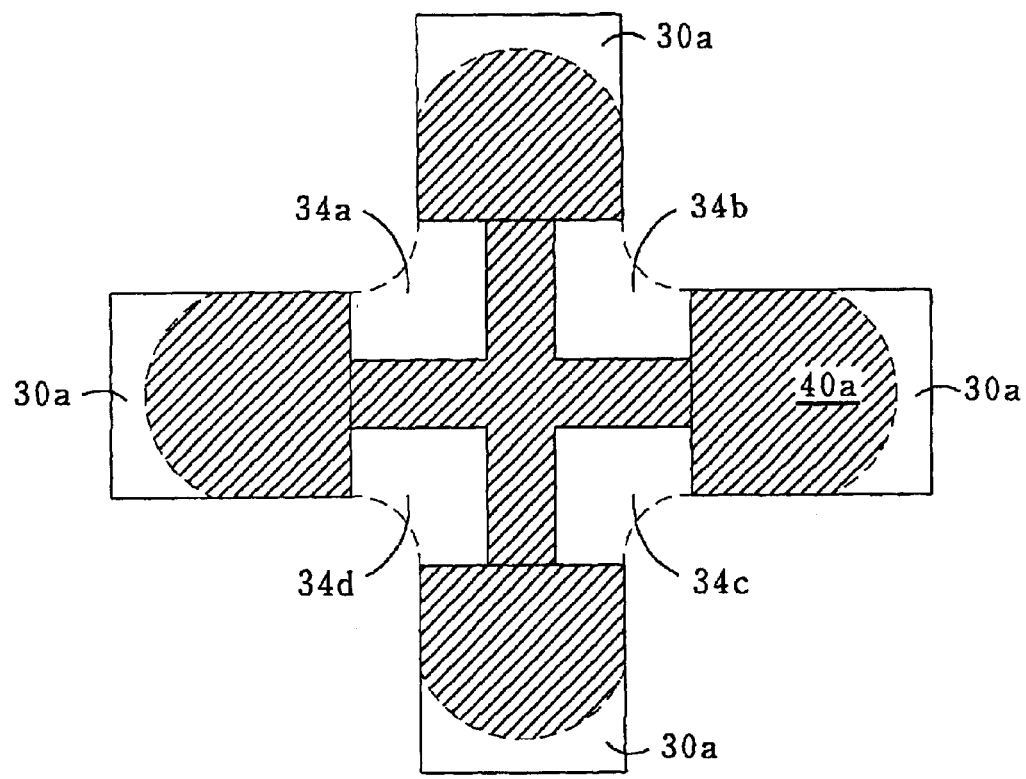
FIG. 5 is schematic vertical views showing the contour image of the crossed-shaped feature pattern after carrying out a serif method in accordance with the prior art.

Then, according to the FIG. 3A of the prior art that is schematic vertical views showing an uncorrected crossed-shaped feature pattern 30 after dividing method, the un-corrected crossed-shaped feature pattern 30 is divided into three rectangular-shaped or trapeze-shaped divided feature patterns 90a, 90b, and 90c as shown in FIG. 9A and there is no extra data points (the original un-corrected crossed-shaped feature pattern 30 has four data points 32A, 32B, 32C, and 32D) and no extra mask units (shown in FIG. 9B) are increased after the un-corrected crossed-shaped feature pattern 30 is divided.

Figure 10:
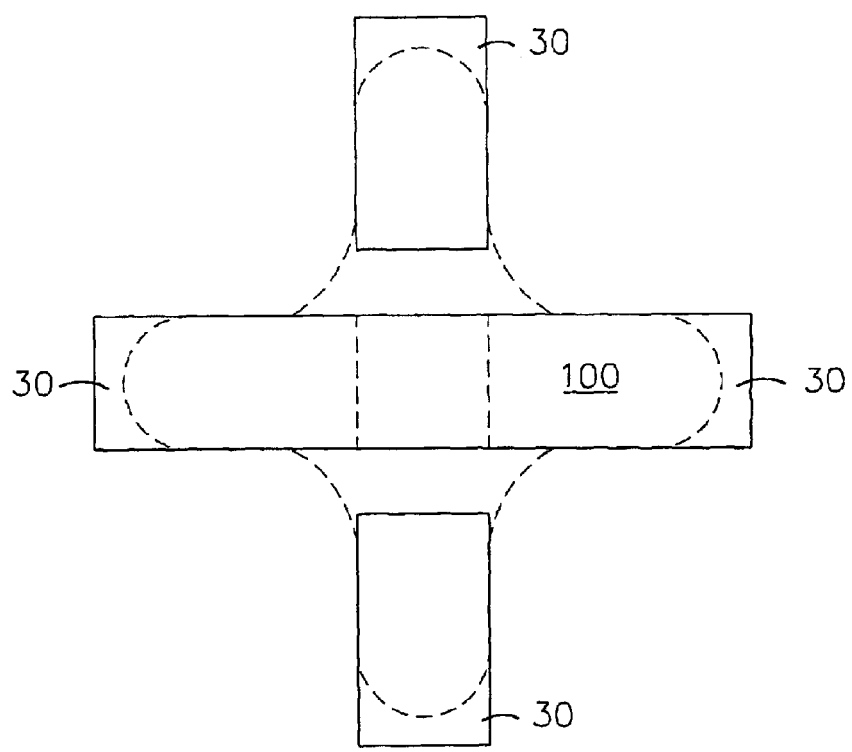
FIG. 10 is schematic vertical views showing the contour image of the crossed-shaped feature pattern in accordance with a method disclosed herein.

Next, the FIG. 10 is schematic top views showing a contour image of the uncorrected crossed-shaped feature pattern 30. The scope of the solid line is an original un-corrected crossed-shaped feature pattern 30, after exposure steps, the scope of dotted line is a simulation area image 100 is smaller than the original un-corrected crossed-shaped feature pattern 30. Furthermore, the contour image 100 shows a similar corner correction effect.

According to above-mentioned, the first preferable embodiment of the present invention is provided a divided method without using extra serif such that the polygon feature pattern can achieve effective OPC and the mask writing time is also improved since the original feature pattern are divided into a few rectangular-shaped or trapeze-shaped writing units for regular mask writing.

The second preferable embodiment of the present invention is provided extended method to divide the polygon feature pattern that can achieve the more effective OPC. In FIG. 11A through FIG. 13B show some variation method of the present invention with additional division for corner shape fine tune, and also schematic top views showing polygon feature patterns such as a L-shaped (shown in FIGS. 11A to 11B), a T-shaped (shown in FIGS. 12A to 12B), and a crossed-shaped (shown in FIGS. 13A to 13B).

Figure 11A:
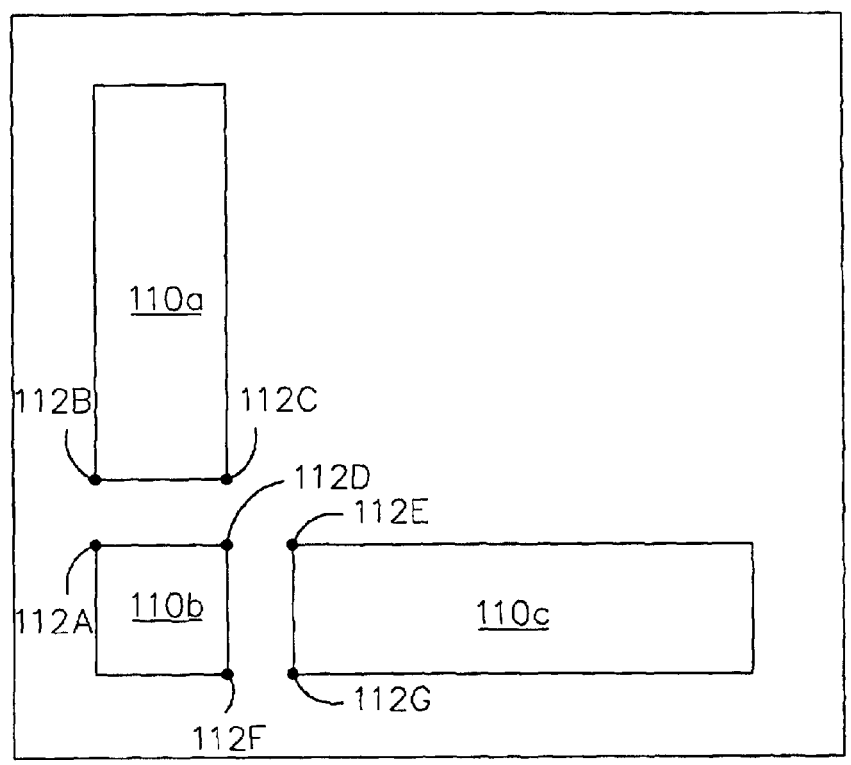
FIGS. 11A to 11B are schematic vertical views showing a variation method of dividing the L-shaped feature pattern into three divided feature pattern in accordance with a method disclosed herein.
Figure 11B:
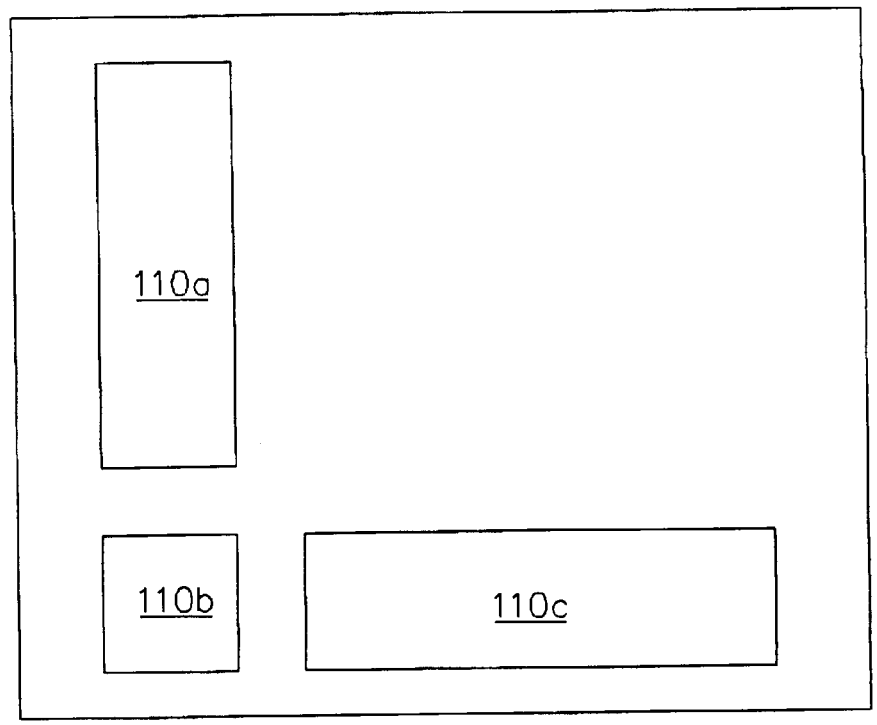

According to the FIG. 1A of the prior art is schematic vertical views showing an un-corrected L-shaped feature pattern 10. After dividing steps d, the un-corrected L-shaped feature pattern 10 is divided into at least three pieces of divided feature patterns 110a, 110b, and 110c as shown in FIG. 11A, and the inner corner is not in the middle of each divided feature patterns. There are six extra data points 112B, 112C, 112D, 112E, 112F, 112G and there is no extra mask unit (shown in FIG. 11B) increased after the uncorrected L-shaped feature pattern 10 is divided. Furthermore, the pattern on the wafer of the divided feature pattern is closed the un-corrected feature pattern after exposure steps.

Figure 12A:
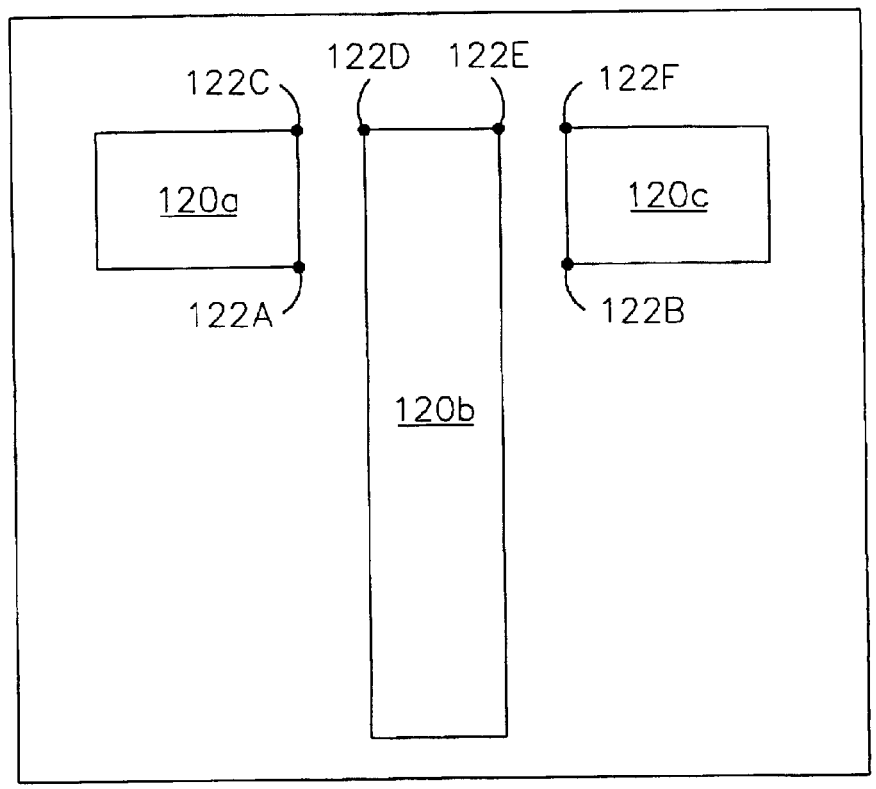
FIGS. 12A to 12B are schematic vertical views showing a variation method of dividing the T-shaped feature pattern into three divided feature pattern in accordance with a method disclosed herein.
Figure 12B:
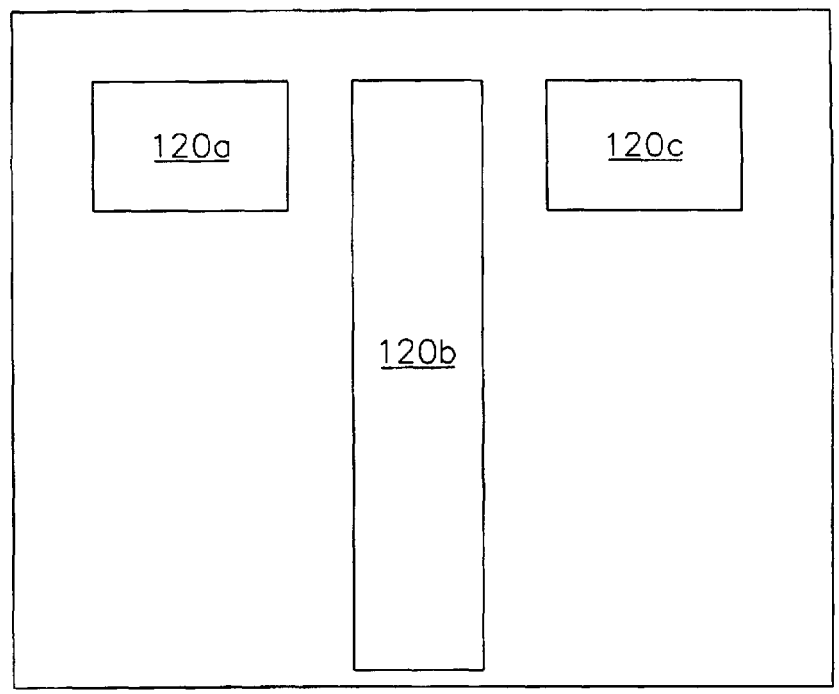

Similarity to the FIG. 11 A, the FIG. 2A is schematic vertical views showing an un-corrected T-shaped feature pattern 20. As shown in FIG. 12A, after dividing steps, the uncorrected T-shaped feature pattern 20 is divided into three rectangular divided feature patterns 120a, 120b, and 120c and there are four extra data points 122C, 122D, 122E, and 122F. Nevertheless, there is also no extra mask unit increased (shown in FIG. 12B), and the inner corners are not in the middle of each divided feature patterns.

Figure 13A:
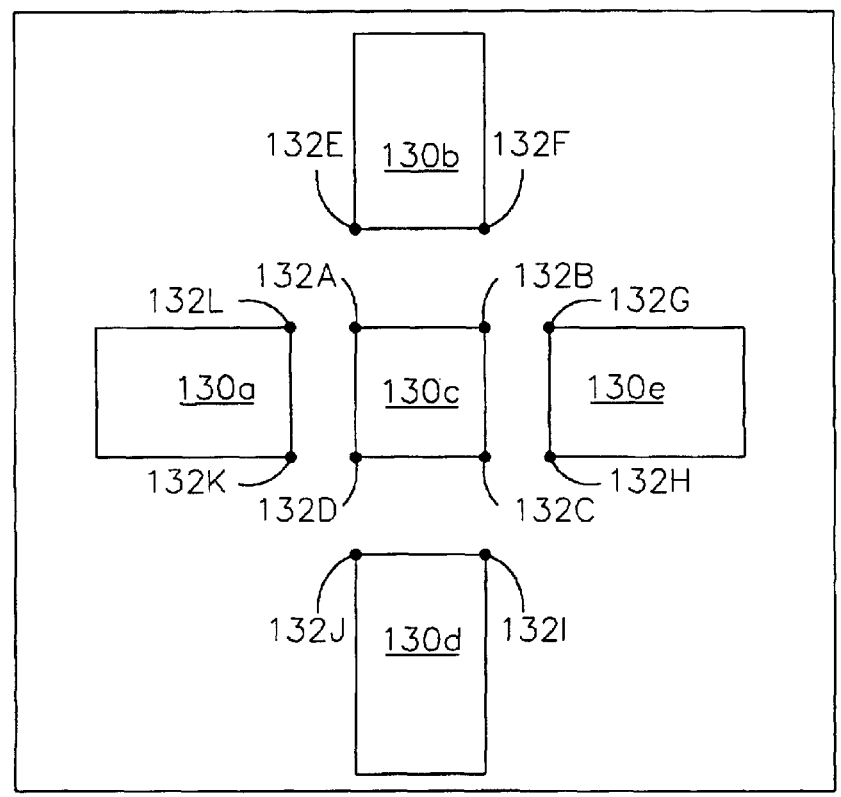
FIGS. 13A to 13B are schematic vertical views showing a variation method of dividing the crossed-shaped feature pattern into five divided feature pattern in accordance with a method disclosed herein.
Figure 13B:
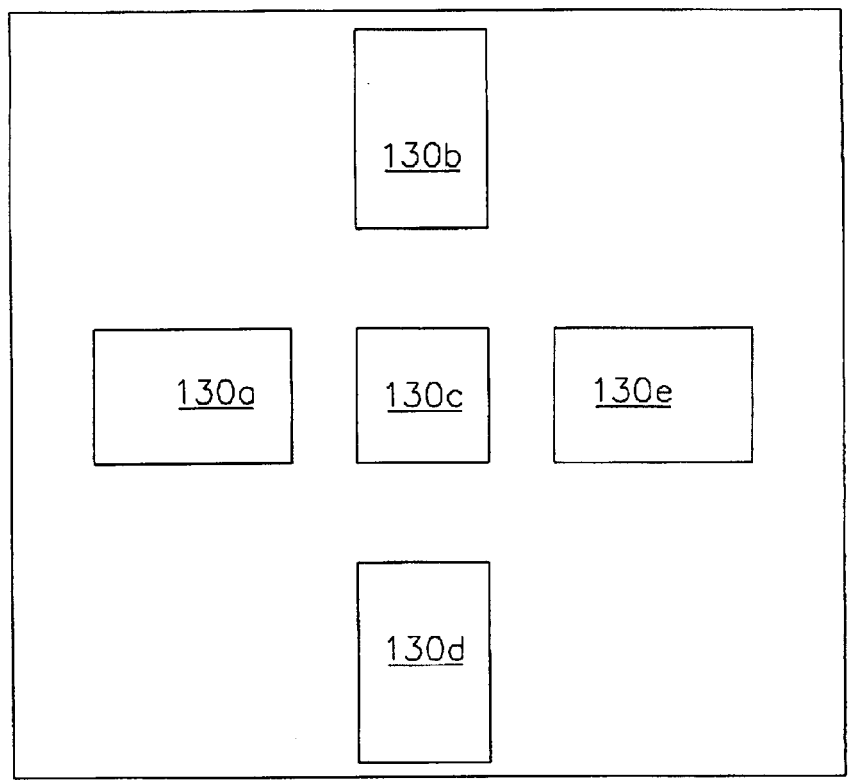

Thereafter, referring to 3A is schematic vertical views showing an un-corrected crossed feature pattern 30 has four data points 32A, 32B, 32C, and 32D. After dividing steps, the original crossed-shaped feature pattern 30 is divided into five rectangular divided feature patterns 130a, 130b, 130c, 130d, and 130e and has eight extra data points 132E, 132F, 132G, 132H, 132I, and 132J as shown in FIG. 13A. Furthermore, as shown in FIG. 13B, there is no extra mask unit increased, and the inner corners are also not in the middle of each divided feature patterns.

Figure 14:
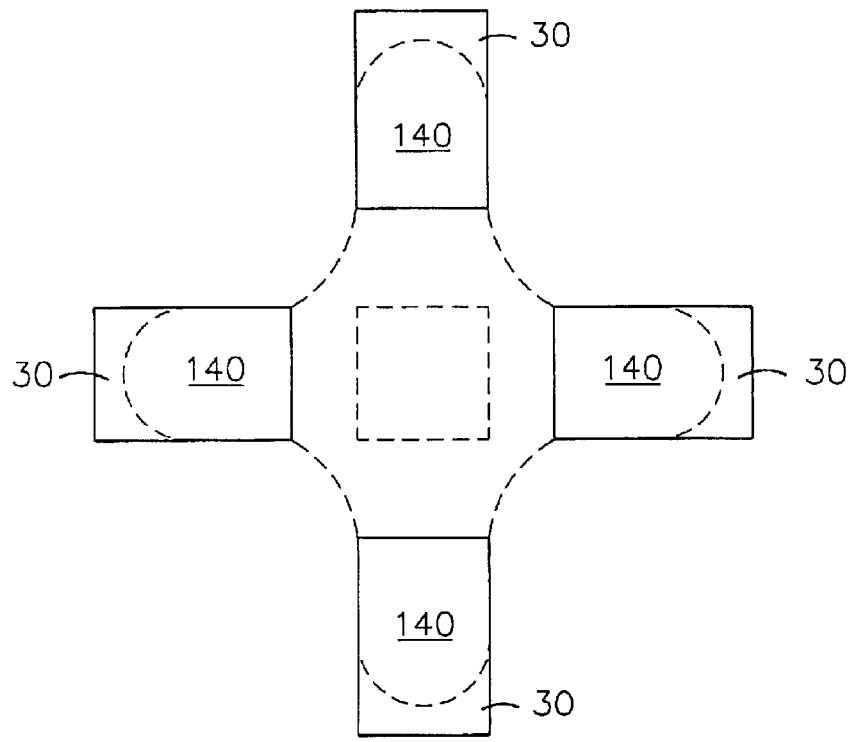
FIG. 14 is schematic vertical views showing the contour image of the crossed-shaped feature pattern in accordance with a method disclosed herein.

Referring to FIG. 14 is schematic top views showing a contour image of the crossed-shaped feature pattern 30. The scope of the solid line is show the original crossed-shaped feature pattern 30, after exposure steps, the simulation area image 140 (the scope of the dotted line as shown in the FIG. 14) is approached to the original crossed-shaped feature pattern 30. Furthermore, the contour of plot all shows a similar corner correction effect.

Even though the extra data point and file size are increased in second embodiment of the present invention that will cause the mask writing time, loading mask time, and inspection time are increased. However, the OPC effectiveness is better than the first embodiment of the present invention and the pattern on the wafer of the divided feature pattern is closed the uncorrected feature pattern.

The summary of the above-mentioned, the present invention is provided variation of the method to divide the polygon feature pattern with corner region into a plurality of rectangular regions which has less extra data point and less extra mask unit increased compared to the conventional serif method, and the inner corner is/are in the middle of each divided feature patterns after an exposure step. Furthermore, the file size can be reduced, and the mask writing time, loading mask time, pattern inspection time, and the pattern on the wafer of the divided feature pattern is closed the uncorrected feature pattern are also improved.

Although specific embodiments have been illustrated and described, it will be obvious to those skilled in the art that various modifications may be made without departing from what is intended to be limited solely by the appended claims.

What is claimed is:

1. A method for correcting a first feature pattern having an inner corner by an optical proximity correction, said method comprising:

removing a portion from the first feature pattern, the removed portion dividing the first feature pattern into a second feature pattern and a third feature pattern, the second and third feature patterns selected from a group consisting of a rectangular, trapezoidal, or pentangular feature patterns and wherein the inner corner is not on a side of the second feature pattern or third feature pattern.

2. The method of claim 1, wherein the inner corner is collocated with a corner of the second feature pattern.

3. The method of claim 2, further comprising:

removing a second portion from the second feature pattern, the removed second portion dividing the second feature pattern into a fourth feature pattern and a fifth feature pattern, the fourth and fifth feature patterns selected from a group consisting of a rectangular, trapezoidal, or pentangular feature patterns and wherein the inner corner is collocated with a corner of the fourth feature pattern.

4. The method of claim 1, wherein the second feature pattern has a second inner corner and further comprising:

removing a second portion from the second feature pattern, the removed second portion dividing the second feature pattern into a fourth feature pattern and a fifth feature pattern, the fourth and fifth feature patterns selected from a group consisting of a rectangular, trapezoidal, or pentangular feature patterns and wherein the second inner corner is not on a side of the fourth feature pattern or the filth feature pattern.

5. The method of claim 4, wherein the second inner corner is collocated with a corner of the fourth feature pattern and the inner corner is collocated with a corner of the third feature pattern.

* * * * *